United States Patent [19]

Hijikata et al.

[11] Patent Number: 4,619,697
[45] Date of Patent: Oct. 28, 1986

[54] SPUTTERING TARGET MATERIAL AND PROCESS FOR PRODUCING THE SAME

[75] Inventors: Kenichi Hijikata, Urawa; Tadashi Sugihara; Masashi Komabayashi, both of Ohmiya, all of Japan

[73] Assignee: Mitsubishi Kinzoku Kabushiki Kaisha, Tokyo, Japan

[21] Appl. No.: 769,935

[22] Filed: Aug. 27, 1985

[30] Foreign Application Priority Data

Aug. 30, 1984 [JP] Japan .................. 59-181553
Aug. 30, 1984 [JP] Japan .................. 59-181551
Aug. 30, 1984 [JP] Japan .................. 59-181552
Nov. 1, 1984 [JP] Japan .................. 59-230996
Dec. 5, 1984 [JP] Japan .................. 59-256803
Jan. 16, 1985 [JP] Japan .................. 60-5157

[51] Int. Cl.⁴ .......................................... C22C 29/00
[52] U.S. Cl. ............................ 75/230; 204/291; 204/292; 419/10; 419/23; 419/27; 419/66; 428/446; 501/96; 501/154
[58] Field of Search .......... 75/230; 501/154, 96; 204/291, 292; 419/23, 10, 66, 27; 428/446

[56] References Cited

U.S. PATENT DOCUMENTS 3,285,017 11/1966 Henderson et al. .................. 75/234
4,364,100 12/1982 Edmonds et al. ................... 501/154
4,558,017 12/1985 Gupta et al. ........................ 501/96

*Primary Examiner*—Stephen J. Lechert, Jr.
*Attorney, Agent, or Firm*—Frishauf, Holtz, Goodman & Woodward

[57] ABSTRACT

A novel target material for use in the sputter formation of a metal silicide film in electrode wiring in a semiconductor device, and a process for producing such target material are disclosed.

The process for producing the target material is characterized by first impregnating molten silicon into a calcined body containing at least one silicide forming metal component and a silicon component and then forming a sintered body with a reduced oxygen content containing both a metal silicide and silicon.

The target material prepared in accordance with the invention is extremely low not only in oxygen content but also in the concentrations of other impurities and has high deflective strength as compared with the conventional sintered target.

The film formed by sputtering the target of the invention has appreciably reduced impurity levels and hence, very low electric resistivities. The target of the invention enables sputtering to be performed 5 times as fast as in the case using the conventional sintered target.

23 Claims, 2 Drawing Figures

SPUTTERING TARGET MATERIAL AND PROCESS FOR PRODUCING THE SAME

BACKGROUND OF THE INVENTION

The present invention relates to a novel target material for use in the sputter formation of a metal silicide film in electrode wiring in a semiconductor device. The invention also relates to a process for producing such target material.

Recent years have seen the increasing use of films of high-melting metal silicides (e.g. $MoSi_2$, $WSi_2$, $TaSi_2$ and $TiSi_2$) in electrode wiring in semiconductor devices instead of the previously used films of aluminum, Al-Si alloys or polycrystalline silicon. Compared with these electrode wiring materials, high-melting metal silicides have low electric resistivities and high resistance to oxidation at elevated temperatures. Semiconductor devices using such metal silicides in electrode wiring are capable of faster arithmetic operation and can be fabricated with smaller chances of corrosion by chemicals and oxidation by treatments at elevated temperatures.

Films of high-melting metal silicides are conventionally formed by sputtering. Taking as an example molybdenum silicide ($MoSi_2$) formed by reacting Mo with Si, high tensile stress will develop in the silicide film because the silicide has a smaller volume than the sum of the volumes of the individual reactants. The development of tensile stress can be reduced by using Si in excess over Mo, so it is preferred to provide a film composition, or the composition of the target material, such that the atomic ratio of Si to Mo is greater than 2. Another advantage of making a molybdenum silicide film having an excess amount of silicon is that the excess Si is oxidized to form a protective silica film on the film surface, making it compatible with the currently used silicon gate processing. However, if the composition of the target material is such that the atomic ratio of Si to Mo is greater than 4, the film made by sputtering this target material also has a Si/Mo (atomic ratio) greater than 4. This film however has an undesirably high sheet resistance. As will be apparent from the above description with reference to $MoSi_2$, the films of high-melting metal silicides of the type intended for use in electrode wiring in semiconductor devices must have such a composition that $2 < Si/M'$ (atomic ratio) $< 4$ (M': high-melting metal). In order to form films satisfying this relation, the target material used in sputtering must be a composite of $M'Si_2$ and Si and have such a composition that $2 < Si/M'$ (atomic ratio) $\leq 4$.

The target material meeting these two requirements is conventionally produced by first preparing a mixture of M' powder and Si powder so adjusted as to provide the desired target composition and then sintering the mixture by either the normal sintering method or the hot press method.

Production by such powder metallurgical techniques has one serious problem: because of oxygen being present in high volumes ($\simeq 13,000$ ppm) in the powder mix, especially in the Si powder, the resulting target contains as much as about 2,500 ppm of oxygen and the film formed by sputtering this target also has a high oxygen content and exhibits an increased electrical resistance when it is used in electrode wiring in a semiconductor device. The oxygen in the Si powder assumes the chemical form of $SiO_2$ and cannot be removed by ordinary methods.

SUMMARY OF THE INVENTION

The principal object, therefore, of the present invention is to provide a new process for producing a target material that has a dual composite structure made of a metal silicide (e.g. $MSi_2$) and Si and which has a reduced oxygen content. The target material produced by the invention is suitable for use in the sputter formation of a metal silicide film having the desired composition such as one satisfying the relation: $2 < Si/M$ (atomic ratio) $\leq 4$ (wherein M is at least one silicide forming metal component).

As a result of various studies made to attain this object, the present inventors have found that a target material having a very low oxygen content can be obtained by impregnating molten silicon in a calcined body made of at least one silicide forming metal component and a silicon component. The oxygen content which is present in the calcined body predominantly in the form of $SiO_2$ reacts with the impregnating molten Si or the molten Si that has formed as a result of contact of the inherently present Si in the calcined body with the impregnating molten Si or indirect heating of the former by the latter. As a consequence of this reaction, the oxygen in the calcined body is converted to silicon monoxide with is volatile enough to be easily discharged out of the system.

The present invention has been accomplished on the basis of these findings and can be summarized as follows. (1) A process for producing a target material with a reduced oxygen content suitable for use in the formation of a metal silicide film in electrode wiring in a semiconductor device, characterized by first impregnating molten silicon into a calcined body containing at least one silicide forming metal component and a silicon component, and, then forming a sintered body with a reduced oxygen content containing both a metal silicide and silicon. (2) A process as described in (1) wherein part or all of the silicide forming metal component and silicon component forms a compound of the two elements.

DETAILED DESCRIPTION OF THE INVENTION

Figure 1:
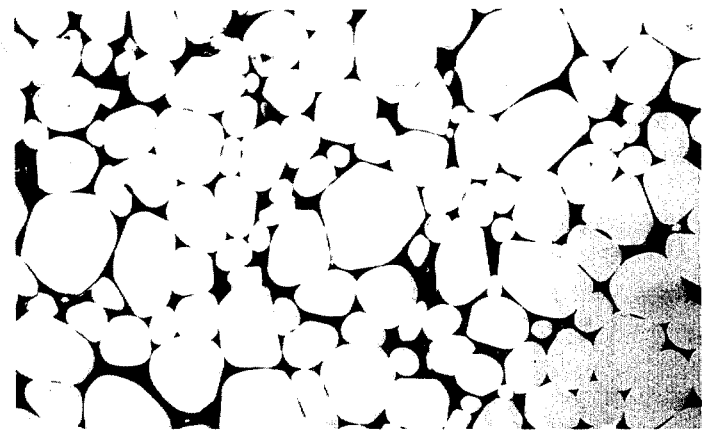

The process of the present invention is hereunder described in detail.

(i) Calcined body

The calcined body prepared in the first step of the claimed process is made of at least one silicide forming metal component and a silicon component. Examples of the silicide forming metal component are Mo, W, Ta, Ti, V, Cr, Zr, Nb, Hf, Re and Y, all of which are capable of forming films of metal silicides having low electric resistivities. Such silicide forming metal components are used either individually or in combination. Part or all of the silicide forming metal component and silicon component in the calcined body forms a compound of the two elements. If all of the silicon component has formed such a compound, the calcined body is exclusively made of $MSi_2$ or other forms of compound of M and Si (e.g. $Mo_5Si_3$). If part of the silicon component has formed a compound, the calcined body is exclusively made of $MSi_2$ and Si or the combination of other forms of compound of M and Si and Si. If two or more silicide forming metal components are used, they in combination with the silicon component may provide a calcined body with either a structure made of a silicide of a certain metal, and a silicide of another metal with the optional presence of Si, or a structure made of a composite metal silicide containing two or more metal components as solid solution, with the optional presence of Si. Alternatively, the calcined body may have a structure part of which is made of a silicide of a certain metal and a silicide of another metal, and the other part of which is a composite metal silicide (i.e., solid solution compounds of two or more metal silicides) that has formed as a result of chemical reaction or which has been incorporated as a starting material. Another possibility is a calcined body that contains not only at least one silicide forming metal component and the silicon component but also other components such as Ru, Pd and Pt which are present in trace amounts. Impurities that may be present in the calcined body without any deleterious effects include Mn, Fe, Co, Ni and Mg.

One process for preparing the calcined body may proceed as follows. A powder of $MSi_2$, M and Si or another form of the compound of M and Si is first provided. Alternatively, two or more $MSi_2$ powders may be used. If an M powder, Si powder and a powder of another form of the compound of M and Si are used, two or more of these powders are so mixed as to provide the necessary compositional ratios. After thorough mixing of the individual powders, the blend is well dried and shaped into a compact by a suitable means such as single-shaft pressing or cold isostatic pressing (CIP). The compact is then heat-treated in an oxygen-free atmosphere at a temperature between 1200° and 1750° C. for a period that is determined by the specific temperature used, thereby providing a calcined body having the structure described in the previous paragraph. Instead of using a two-stage process consisting of shaping and heat treatment steps, the calcined body may be directly obtained from a powder mixture by a single stage of vacuum hot pressing.

The calcined body may be one that has formed during the heating of the compact (formed by single-shaft pressing or CIP) in preparation for the subsequent impregnation step (see Example 8 which is described hereinafter).

The purpose of the heat treatment (i.e., calcination) is to obtain a compact that retains its shape sufficiently to withstand the subsequent contact with molten silicon. By properly changing the calcination temperature or other process parameters, calcined bodies having varying densities can be obtained. If M and Si are used as starting materials, a chemical reaction occurs between M and Si in the calcination step such as to provide $MSi_2$ or another form of the compound of M and Si. If two or more kinds of M and/or two or more compounds of M and Si are used as starting materials, the formation of solid solutions also occurs.

(ii) Impregnation step

By bringing the calcined body into contact with molten silicon having a low oxygen content ($\simeq 1$ ppm) in vacuum (preferably about $10^{-3}$ Torr) preferably at a temperature in the range of 1430° to 1500° C., Si is impregnated in the calcined body so as to provide a target material that is made of a sintered body having a dual structure of a metal silicide (e.g. $MSi_2$) and Si and which has an extremely reduced oxygen content.

As described in the passage that follows the statement of the object of the invention, the oxygen in the calcined body is reacted with molten Si in the impregnation step to be converted to silicon monoxide which is evaporated and discharged from the reaction system. The oxygen content of the target material made of the sintered body can be reduced to a level comparable to that of the impregnant molten Si by sufficiently prolonging the contact with the molten Si. Therefore, the duration of contact between the calcined body and the molten Si is desirably in the range of 60 to 120 minutes. The molten Si with a low oxygen content ($\simeq 1$ ppm) may be prepared from the ultra-pure Si commonly used in the fabrication of semiconductor devices.

As a result of this impregnation step, the sintering of the calcined body occurs, and if the latter contains a compound of M and Si in a form other than that of $MSi_2$, the formation of $MSi_2$ also occurs. In case of a calcined body prepared by the two-stage process consisting of shaping and heat-treatment steps, the voids in the calcined body are filled with Si as a result of impregnation with the molten Si, and the target material made of the resulting sintered body has an increased atomic ratio of Si to M. On the other hand, no such increase in the atomic ratio of Si to M occurs with the target material obtained from a calcined body that has been prepared by the single stage of vacuum hot pressing and which has a relative density of 98% or more, and this is because the only phenomena that take place in the impregnation step are the displacement of Si in the calcined body by the molten Si and the compensation for the Si that has been lost from the calcined body as a result of its combination with the impurity oxygen in the calcined body.

As a consequence, the impregnation step provides a sintered body that has a dual structure of a metal silicide (e.g. $MSi_2$) and Si and which has a very low level of oxygen content.

(iii) Controlling the atomic ratio of Si to M in the target material

A target material having a desired atomic ratio of Si to M can be obtained by properly changing either the Si/M (atom. ratio) of the premix for the preparation of the calcined body or the density of the calcined body. For example, in the case of calcined $MoSi_2$ that has been prepared by the two-stage process consisting of shaping and heat-treatment steps, if the Si/Mo ratio of the premix composed of Mo and Si powders is less than 3/5 (i.e., Mo being in excess over Si), $MoSi_2$ forms in an excessively great amount during impregnation with molten Si and the compact of a calcined body is unable to retain its own shape because of the evolution of an excessively great amount of heat of reaction. According to an experiment conducted by the inventors, a calcined body having a Si/Mo ratio of 4.0 resulted from a premix with a Si/Mo ratio of approximately 2.0. Therefore, if the two-stage process consisting of shaping and heat-treatment steps is used for the preparation of a calcined body, the Si/Mo ratio of the premix is advantageously varied within the range of 3/5 to about 2.0, and by so doing, sintered bodies having Si/Mo ratios in the range of 2.57 to 4.0 can be obtained (see Table 3 shown hereinafter).

A sintered body of $MoSi_2$ may be prepared from a mixture of Mo and Si powders by the single step of vacuum hot pressing. In this case, if the Si/Mo ratio of the premix is greater than 2 and if the temperature of hot pressing is not lower than 1400° C., a calcined body having a relative density of 98% or higher is formed quite easily. As already mentioned, the only phenomena that occur in such a highly dense body are the displacement of the Si in the calcined body by the molten Si and the compensation for the Si that has been lost from the calcined body as a result of its combination with the impurity oxygen in the calcined body. As a consequence, the target material obtained from the calcined body assumes a Si/Mo value that is substantially equal to that of the Si/Mo ratio of the premix from which the calcined body has been prepared. In order to ensure easy control over the Si/Mo ratio of the target material, the Si/Mo ratio of the premix for the preparation of the calcined body by vacuum hot pressing is preferably more than 2 (see Table 4 which is shown hereinafter). If the Si/Mo ratio of the premix for the preparation of the calcined body by vacuum hot pressing is less than 3/5, the resulting calcined body is unable to retain its shape during the subsequent impregnation step as in the case of the calcined body prepared by the two-stage process. Again the Si/Mo ratio of the sintered body depends on the density of the calcined body prepared by vacuum hot pressing if the premix satisfies the relation: $3/5 \leq Si/Mo \leq 2$, and sintered bodies having Si/Mo ratios in the range of 2.10 to 4.00 can be obtained (see Example 5 given hereunder).

The next subjects to be considered are how to change the density of the calcined body and what changes occur in the Si/Mo ratio of the target material.

First of all, the density of the calcined body can be changed by varying the temperature of heat treatment (calcination) of the premix. This effect is significant when the calcined body is prepared by the two-stage process consisting of shaping and heat-treatment steps, and the higher the temperature of heat treatment, the higher the density of the resulting calcined body increases. As the density of the calcined body increases, the amount of molten Si that is impregnated in the calcined body decreases, and this causes a corresponding decrease in the Si/M ratio of the resulting target material (see Table 2 and compared Example 1 with Example 3 shown below).

The density of a calcined body prepared by vacuum hot pressing can be controlled easily by changing the temperature or pressure used in the hot pressing. This effect is particularly significant when the Si/M ratio of the premix for the preparation of the calcined body is not lower than 3/5 but not higher than 2. As in the case of the calcined body prepared by the two-stage process, the amount of molten Si that can be impregnated in the calcined body prepared by vacuum hot pressing decreases with the increasing density of the calcined body and the Si/M ratio of the resulting target material decreases accordingly.

Given the same temperature of heat treatment and the same Si/M ratio of the premix for the preparation of the sintered body, the density of the calcined body varies depending upon whether the starting materials are compounds or in the form of elements. For example, if a mixture of Mo and Si powders (Si/Mo=2) is shaped into a compact which is subsequently heat-treated at 1500° C., the resulting calcined body of MoSi$_2$ has a density of 3.00 g/cm$^3$. If, on the other hand, a MoSi$_2$ powder is likewise treated, sintered MoSi$_2$ having a density of 4.70 g/cm$^3$ is obtained. In other words, the calcined body prepared from a starting material in a compound form has a higher density than the one prepared from starting materials in the elemental form, and this causes a reduction not only in the amount of molten Si that can be impregnated in the calcined body but also in the Si/M ratio of the finally obtained sintered body.

As will be understood from the above description, the atomic ratio of Si/M of the target material can be adjusted to a desired value, for example in the range greater than 2 but not greater than 4, by properly changing either the atomic ratio of Si/M in the premix for the preparation of the calcined body or the density of the calcined body.

The advantages of the claimed process of the present invention are hereunder described in greater detail by reference to the following non-limiting working examples.

EXAMPLE 1

A molybdenum powder (O$_2$ content: 1,400 ppm) composed of particles with an average size of 3 μm and a silicon powder (O$_2$ content: 13,000 ppm) having an average particle size 1.5 μm were provided. A composition made of 63 parts by weight of the Mo powder and 37 parts by weight of the Si powder was kneaded in a ball mill for 2 hours using hexane as a solvent. The mixture was dried thoroughly and shaped into a compact (30 mm×30 mm×5 mm) with a single-shaft press at a pressure of 2 tons/cm$^2$. The compact was heated at 1200° C. for 1 hour in a vacuum of 10$^{-3}$ Torr to obtain a MoSi$_2$ composition, which was subsequently heat-treated at 1700° C. for 1 hour to make a sintered body (O$_2$ content: 1,800 ppm) having a density of 4.10 g/cm$^3$.

The sintered body of MoSi$_2$ was then impregnated for 4 hours with molten Si (O$_2$ content: 1 ppm) at 1500° C. in a vacuum of 10$^{-3}$ Torr and then furnace-cooled, thereby producing a sintered body with a dual structure of MoSi$_2$ and Si (Si/Mo ratio=3.06) having an oxygen content of 6 ppm.

Instead of the sintered body of MoSi$_2$, those of WSi$_2$, TaSi$_2$ and TiSi$_2$ were subjected to the same treatment of impregnation with molten Si except for the duration of impregnation. In the case of TiSi$_2$, both the heat treatment of the compact and the impregnation of the calcined body with molten Si were effected at 1430° C. The results of these experiments are shown in Table 1 together with the data obtained for the preparation of the sintered body having a dual structure of MoSi$_2$ and Si.

TABLE 1

| Calcined body | | Duration of im- pregnation (hr.) | Sintered body | |
|---|---|---|---|---|
| Type | O$_2$ content (ppm) | | Si/M (atomic ratio) | O$_2$ content (ppm) |
| MoSi$_2$ | 2000 | 4 | 3.06 | 6 |
| MoSi$_2$ | 2000 | 2 | 3.06 | 5 |
| MoSi$_2$ | 2000 | 1 | 3.06 | 8 |
| WSi$_2$ | 2200 | 1 | 3.11 | 9 |
| WSi$_2$ | 2200 | 2 | 3.11 | 6 |
| TaSi$_2$ | 1800 | 2 | 3.18 | 5 |
| TaSi$_2$ | 2300 | 2 | 2.63 | 6 |

EXAMPLE 2

A MoSi$_2$ powder (O$_2$ content: 5,500 ppm) with an average particle size of 5 μm was shaped into a rectangular prism (30 mm×30 mm×5 mm) by single-shaft pressing at a pressure of 2 tons/cm$^2$. The prism had a density of 3.30 g/cm$^3$ (relative density: 52.9%). It was then heated at 1450° C. for 1 hour in a vacuum of 10$^{-3}$ Torr to provide a calcined body having a density of 4.80 g/cm$^3$ (O$_2$ content: 3,500 ppm).

The calcined body was then brought into contact with molten Si (O$_2$ content: 1 ppm) for a period of 90 minutes at 1450° C. in a vacuum of $10^{-3}$ Torr and furnace-cooled thereafter.

The resulting sintered body had a density of 5.33 g/cm³ and a porosity of not higher than 1%. The content of $MoSi_2$ in this sintered body was 77 vol % and the balance was Si. The atomic ratio of Si to Mo in the sintered body was 2.60 and its oxygen content was 10 ppm.

Experiments were conducted under the same conditions except for the temperature of calcination. The results are shown in Table 2 together with the data for the first experiment. When the temperature for calcination was higher than 1500° C., the calcined bodies were impregnated with Si at 1500° C.

TABLE 2

| Calcination temperature (°C.) | Density of calcined body (g/cm³) | Sintered body | | |
|---|---|---|---|---|
| | | $MoSi_2$ content (vol %) | Si/Mo (atomic ratio) | $O_2$ content (ppm) |
| 1450 | 4.80 | 77 | 2.60 | 10 |
| 1520 | 5.12 | 82 | 2.44 | 12 |
| 1550 | 5.31 | 85 | 2.35 | 13 |
| 1580 | 5.62 | 90 | 2.22 | 15 |
| 1620 | 5.93 | 95 | 2.11 | 18 |

EXAMPLE 3

A compact (30 mm×30 mm×5 mm) was prepared by using the same starting materials, formulation (the gram atomic ratio of Si to Mo being 2.006), and mixing and shaping methods as used in Example 1. The resulting compact had a density of 2.52 g/cm³. It was then heated up to 1200° C. at a rate of 600° C./hr. in a vacuum of $10^{-3}$ Torr so that the composition of the compact was converted to $MoSi_2$ by chemical reaction. The $MoSi_2$ composition was subsequently heat-treated at 1500° C. for 1 hour to provide a calcined body having a density of 3.00 g/cm³ and an oxygen content of 2,600 ppm.

The calcined body was impregnated with Si by means of contact with molten Si ($O_2$ content: 1 ppm) for 60 minutes at 1500° C. in a vacuum of $10^{-3}$ Torr. After furnace-cooling, a sintered body having a density of 4.28 g/cm³ and a porosity not higher than 1% was obtained. The content of $MoSi_2$ in the sintered body was 50 vol % and the balance was Si. The atomic ratio of Si to Mo in the sintered body was 4.00 and its oxygen content was 7 ppm.

Experiments were conducted under the same conditions except for the ratio of mixing Mo and Si powders, and the results are shown in Table 3 together with the data obtained in the first experiment.

TABLE 3

| Si/Mo in powder mix (atomic ratio) | Sintered body | | |
|---|---|---|---|
| | $MoSi_2$ content (vol %) | $Si/O_2$ (atomic ratio) | $O_2$ content (ppm) |
| 2.006 | 50 | 4.00 | 7 |
| 1.607 | 57 | 3.53 | 9 |
| 1.328 | 62 | 3.24 | 11 |
| 1.020 | 70 | 2.87 | 9 |
| 0.600 | 78 | 2.57 | 10 |

EXAMPLE 4

A mixture of Mo and Si powders having a Si/Mo atomic ratio of 2.28 was provided as in Example 3. The mix was then hot-pressed at 1300° C. and 150 Kgf/cm² for 1 hour in a vacuum of $10^{-3}$ Torr to provide a calcined body having a density of 5.50 g.cm³ and an oxygen content of 6,200 ppm.

This calcined body was impregnated with Si as in Example 3 to provide a sintered body. It has a density of 5.77 g/cm³ and its atomic ratio of Si to Mo was 2.30. The content of $MoSi_2$ in the sintered body was 87 vol % and the balance was Si. The sintered body had an oxygen content of 19 ppm.

Experiments were conducted under the same conditions except for the ratio of mixing the Mo and Si powders, and the results are shown in Table 4 together with the data obtained in the first experiment.

TABLE 4

| Si/Mo in powder mix (atomic ratio) | Sintered body | | |
|---|---|---|---|
| | $MoSi_2$ content (vol %) | Si/Mo (atomic ratio) | $O_2$ content (ppm) |
| 2.280 | 87 | 2.30 | 19 |
| 2.473 | 81 | 2.47 | 15 |
| 3.029 | 66 | 3.02 | 16 |
| 3.415 | 59 | 3.40 | 12 |
| 4.000 | 50 | 3.97 | 14 |

EXAMPLE 5

A $MoSi_2$ powder ($O_2$ content: 5,500 ppm) having an average particle size of 5 μm was hot-pressed at 1230° C. and 150 Kgf/cm² for 1 hour in a vacuum of $10^{-3}$ Torr so as to provide a calcined body of $MoSi_2$ having a density of 4.68 g/cm³ and an oxygen content of 5,100 ppm.

This calcined body was impregnated with Si as in Example 3 to provide a sintered body. It has a density of 5.26 g/cm³ and its atomic ratio of Si to Mo was 2.67. The content of $MoSi_2$ in the sintered body was 75 vol % and the balance was Si. The sintered body had an oxygen conent of 13 ppm.

Experiments were conducted as above except for the ratio of mixing the Mo and Si powders or the temperature and pressure of hot pressing. The results are shown in Table 5 together with the data for the first experiment.

TABLE 5

| Si/Mo in powder mix (atomic ratio) | Hot pressing | | Density of calcined body (g/cm³) | Sintered body | | |
|---|---|---|---|---|---|---|
| | temperature (°C.) | pressure (Kgf/cm²) | | $MoSi_2$ content (vol %) | Si/Mo (atomic ratio) | $O_2$ content (ppm) |
| 2.000 | 1490 | 150 | 5.94 | 95 | 2.11 | 20 |
| 2.000 | 1490 | 75 | 5.49 | 88 | 2.28 | 15 |
| 2.000 | 1230 | 150 | 4.68 | 75 | 2.67 | 13 |
| 2.000 | 910 | 150 | 3.12 | 50 | 4.00 | 10 |
| 0.600 | 1350 | 150 | 6.43 | 86 | 2.33 | 15 |

EXAMPLE 6

A $WSi_2$ powder ($O_2$ content: 6,200 ppm) with an average particle size of 4 μm was shaped into a rectangular prism (30 mm×30 mm×5 mm) by single-shaft pressing at a pressure of 2 tons/cm². The prism had a density of 4.95 g/cm³ It was then heated at 1500° C. for 1 hour in a vacuum of $10^{-3}$ Torr to provide a calcined body having a density of 7.40 g/cm³ and an oxygen content of 3,800 ppm. It was then impregnated with Si by means of contact with molten Si ($O_2$ content: 1 ppm) for a period of 60 minutes at 1500° C. in a vacuum of $10^{-3}$ Torr and furnace-cooled thereafter to provide a sintered body having a density of 7.98 g/cm³. The content of WSi$_2$ in the sintered body was 75 vol % with the balance being Si. The atomic ratio of Si to W in the sintered body was 2.67 and its oxygen content was 12 ppm.

A sintered body made of TaSi$_2$ and Si was obtained as above except that the starting material was a TaSi$_2$ powder having an average particle size of 4 μm and an oxygen content of 5,800 ppm. The resulting sintered body had a density of 7.16 g/cm$^3$ and its TaSi$_2$ content was 71 vol %. The atomic ratio of Si to Ta in the sintered body was 2.88, with its oxygen content being 10 ppm.

When M=Ti, a TiSi$_2$ powder having an average particle size of 45 μm and an oxygen content of 2,500 ppm was used and the calcined body prepared from this powder was impregnated with Si at a lower temperature (1430° C.) so as to provide a sintered body having a density of 3.90 g/cm$^3$. The content of TiSi$_2$ in this sintered body was 86 vol %, with the balance being Si. The atomic ratio of Si to Ti in the sintered body was 2.34, with its oxygen content being 9 ppm.

EXAMPLE 7

Six powders were provided; they were a Mo powder (O$_2$ content: 1,400 ppm) with an average particle size of 3 μm, a Si powder (13,000 ppm and 1.5 μm), a MoSi$_2$ powder (5,500 ppm and 5 μm), a WSi$_2$ powder (6,200 ppm and 4 μm), a TaSi$_2$ powder (5,800 ppm and 4 μm), and a TiSi$_2$ powder (2,500 ppm and 45 μm). Two or more of these powders were blended in the proportions indicated in Table 6 and compacts measuring 30 mm×30 mm×5 mm were prepared by using the same mixing and shaping methods as used in Example 1.

TABLE 6

| Run No. | Formulation of powder mix (wt %) | | | | | | O$_2$ content in calcined body (ppm) | Sintered body | | |
|---|---|---|---|---|---|---|---|---|---|---|
| | Mo | Si | MoSi$_2$ | WSi$_2$ | TaSi$_2$ | TiSi$_2$ | | MSi$_2$ content (vol %) | Si/M (atomic ratio) | O$_2$ content (ppm) |
| 1 | — | — | 50 | 50 | — | — | 6000 | 76 | 2.64 | 10 |
| 2 | 31.5 | 18.5 | — | — | 50 | — | 2600 | 63 | 3.18 | 8 |
| 3 | — | — | — | 75 | — | 25 | 4700 | 80 | 2.50 | 12 |
| 4 | — | — | 50 | 25 | — | 25 | 5100 | 78 | 2.57 | 11 |
| 5 | 31.5 | 18.5 | — | 30 | 20 | — | 2500 | 62 | 3.24 | 7 |
| 6 | — | — | 30 | 30 | 30 | 10 | 5400 | 74 | 2.71 | 10 |

Run Nos. 2 and 5 were first heated at 1200° C. for 1 hour in a vacuum of 10$^{-3}$ Torr and subsequently heated at 1700° C. for 1 hour to provide calcined bodies. Run Nos. 1, 3, 4 and 6 were heat-treated at 1500° C. for 1 hour in a vacuum of 10$^{-3}$ Torr to provide calcined bodies having the oxygen contents indicated in Table 6.

Subsequently, Run Nos. 1, 2 and 5 were impregnated with molten Si (O$_2$ content: 1 ppm) for a period of 1 hour at 1500° C. in a vacuum of 10$^{-3}$ Torr, whereas Run Nos. 3, 4 and 6 were impregnated with the same molten Si for a period of 1 hour at 1430° C. in a vacuum of 10$^{-3}$ Torr. The resulting sintered bodies had the MSi$_2$ contents, Si/M atomic ratios and oxygen contents shown in Table 6.

EXAMPLE 8

A MoSi$_2$ powder having an average particle size of 5 μm and an oxygen content of 5,500 ppm was shaped into a rectangular prism (30 mm×30 mm×5 mm) by single-shaft pressing at a pressure of 2 tons/cm$^2$. The prism had a density of 3.30 g/cm$^3$ (relative density: 52.9%).

The prism was overlaid with a silicon sheet weighing 3.7 g and heated up to 1350° C. at a rage of 300° C./hr. to produce a calcined body. It was further heated to 1425° C. at a rate of 50° C./hr., and at that temperature, it was held for 30 minutes in a vacuum of 10$^{-3}$ Torr and furnace-cooled thereafter. The silicon sheet was melted and impregnated in the calcined body of MoSi$_2$ to provide a sintered body having a density of 5.18 g/cm$^3$ and a porosity of not higher than 1%.

The content of MoSi2 in the sintered body was 75 vol %, with the balance being Si. The atomic ratio of Si to Mo in the sintered body was 2.75, with its oxygen content being 10 ppm.

Sintered bodies were likewise prepared from three different powders, a WSi$_2$ powder having an oxygen content of 6,200 ppm and an average particle size of 4 μm, a TaSi$_2$ powder (5,800 ppm, 4 μm) and a TiSi$_2$ powder (2,500 ppm and 45 μm). The results are shown in Table 7.

TABLE 7

| Starting material | Sintered body | | |
|---|---|---|---|
| | MSi$_2$ content (vol %) | Si/M (atomic ratio) | O$_2$ content (ppm) |
| MoSi$_2$ | 73 | 2.75 | 10 |
| WSi$_2$ | 70 | 2.87 | 11 |
| TaSi$_2$ | 67 | 3.06 | 10 |
| TiSi$_2$ | 82 | 2.46 | 8 |

The process in accordance with the present invention is capable of producing a target material with an oxygen level of 20 ppm or below. By using this material as a sputter target, a film of high-melting metal silicide can be formed that has an oxygen content comparable to that of the target. Since this film has a very low oxygen content, its sheet resistance is sufficiently low to render it suitable for use in electrode wiring in a semiconductor device.

The inventors made intensive studies on the relationship between the structure and physical properties of the target material produced by the process described in the foregoing pages. As a result, the inventors obtained the following observations and accomplished a novel target material which constitutes the other aspect of the present invention. (1) The target material having a dual structure of silicon and a disilicide of a high-melting metal that is produced by the above described process has a novel dual structure wherein the particles of the high-melting metal disilicide of the formula MSi$_2$ (wherein M=Mo, W, Ta or Ti) and/or a solid solution compound of said high-melting metal disilicide are dispersed in a continuous silicon matrix. (2) (i) The composite target material described in (1) has a very low oxygen content ($\leq$20 ppm). Furthermore, this material has lower contents of other impurities (e.g. Na, K and C) than the conventional sintered target. Therefore, the film prepared by sputtering this composite target has a low electric resistivity and provides electrodes that will experience minimum variations in potential from one electrode to another.

(ii) The individual descrete particles dispersed in the composite target never exceed 1 mm in size. Furthermore, they are uniformly dispersed in the silicon matrix. Therefore, the composite target is capable of forming a film that is stabler in composition than the film formed by sputtering the conventional sintered target (i.e., the film formed by sputtering the center of the target does not have a great difference in composition compared with the film obtained by sputtering the periphery of the target, and in addition, a single target will provide a plurality of films that are uniform in composition).

(iii) The rate of deposition of the film from the sputtered target is much faster than that achieved by the sputtering of the conventional sintered target or composite target.

(iv) The composite target of the present invention has high mechanical strength.

The second aspect of the present invention has been achieved on the basis of these findings and is summarized as follows. (1) A composite target having a structure wherein the particles of a high-melting metal disilicide of the formula $MSi_2$ (wherein M=Mo, W, Ta or Ti) and/or a solid solution compound of said high-melting metal disilicide are dispersed in a continuous silicon matrix. (2) A composite target as described in (1) wherein the continuous silicon matrix accounts for not smaller than 5 vol % of the composite target. (3) A composite target as described in (1) or (2) wherein the dispersed particles of the high-melting metal disilicide and/or the solid solution compound of said high-melting metal disilicide are present as discrete particles which are either circular or elliptical in cross section. (4) A composite target as described in (1) or (2) wherein the dispersed particles of the high-melting metal disilicide and/or the solid solution compound of said high-melting metal disilicide are present both as discrete particles which are either circular or elliptical in cross section and as agglomerates of such particles. (5) A composite target as described in (1) or (2) wherein the dispersed particles of the high-melting metal disilicide and/or the solid solution compound of said high-melting metal disilicide are present as agglomerates of discrete particles which are either circular or elliptical in cross section. (6) A composite target as described in any one of (3) to (5) wherein the discrete particles which are either circular or elliptical in cross section have sizes ranging from 5 to 500 μm. (7) A composite target as described in any one of (1) to (6) that has a porosity of not higher than 1 vol %.

Figure 2:
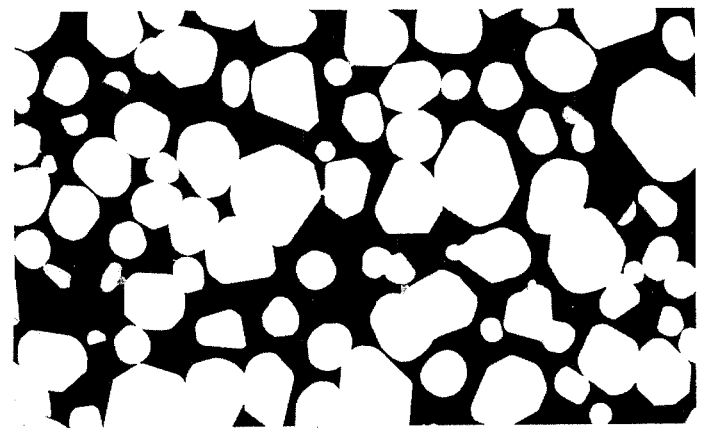

FIG. 1 is a scanning electron micrograph showing the structure of the composite target prepared in Example 9; and FIG. 2 is a scanning electron micrograph showing the structure of composite target sample No. 10 prepared in accordance with the present invention.

As shown in FIG. 1, the composite target of the present invention has such a structure that the particles of a high-melting metal disilicide of the formula $MSi_2$ (wherein M=Mo, W, Ta or Ti) and/or a solid solution compound of said high-melting metal disilicide are dispersed in a continuous silicon matrix. In FIG. 1, Si appears as occasional islands left within the dispersed particles but this is because FIG. 1 is a cross sectional view and, the Si islands actually extend perpendicularly with respect to the photo and make a continuous matrix.

The composite target shown in FIG. 1 has $MoSi_2$ and Si contents of 80.0 vol % and 19.9 vol %, respectively, and a porosity of 0.1 vol %. In this target, two types of particles exist: the first type is a group of discrete particles which are either circular or elliptical in cross section, and the second type is that of agglomerates of such discrete particles. The discrete particles have sizes ranging from 10 to 200 μm. The agglomerates of discrete particles are those which are formed as a result of agglomeration of the discrete particles that have grown in the step of calcination or impregnation with molten silicon.

If the dispersed particles occupy a space greater than 80 vol % or silicon occupies a space smaller than 20 vol %, the tendency of the discrete particles to agglomerate together will increase until only agglomerates are found in the silicon matrix. The proportion that must be provided by Si in order to form a continuous matrix depends not only on the size range of the discrete particles but also on the area of the surface at which one discrete particle joins with another. As a guide, if the discrete particles have a size range of 5 to 500 μm, the proportion provided by Si in order to make a continuous matrix must be at least 5 vol %, with the volume of the composite target including the pores in it being taken as 100. This is equivalent to saying that Si/Mo (atomic ratio)$\geq 2.10$ assuming M=Mo.

If, on the other hand, the dispersed particles occupy a space smaller than 80 vol % or silicon occupies a space larger than 20 vol %, the tendency for agglomerated particles to form decreases until all of the particles dispersed in the Si matrix are discrete particles having either a circular or elliptical cross section (see FIG. 2). In this state, Si assumes at least 50 vol % of the composite target. In order to satisfy the requirement for lower sheet resistances, the composition of the film formed by sputtering the target is preferably such that Si/M (atomic ratio)$\leq 4.0$, and therefore, it is also preferred that the atomic ratio of Si/M in the composite target is not more than 4.0. In order to meet this compositional requirement, the content of $MoSi_2$ in the target, assuming M=Mo, must not be lower than 50 vol % while the Si content must not be higher than 50 vol %. Therefore, if M=Mo, the preferred proportion of the target occupied by Si is no more than 50 vol %.

The size range of the discrete particles can be controlled over the range of 1–1000 μm, but the preferred range is from 5 to 500 μm. Making discrete particles having a minimum size of less than 5 μm involves great difficulty in workmanship (e.g. the calcined body cannot be impregnated with molten silicon without increasing the porosity to 1% or higher). If the maximum size of the discrete particles exceeds 500 μm, the compositional stability of the film formed by sputtering the composite target is impaired and the strength of that film is reduced. The more preferred size rang of the discrete particles is from 10 to 200 μm.

Because of the unique process used in its manufacture and the presence of a continuous silicon matrix, the composite target in accordance with the second aspect of the invention has a high density and its porosity is typically not more than 1 vol %. Therefore, the composite target of this invention has a high mechanical strength.

While the composite target described above can be produced by the process in accordance with the first aspect of the invention (i.e., impregnation of a calcined body with molten silicon), the following method may also be used to produce this composite target. That is, the composite target may be produced by cooling a melt that is composed of M and Si and which has the desired atomic ratio of Si on the condition that its composition is within the range where $MSi_2$ is in excess over the eutectic composition of M and Si. As the melt is cooled, $MSi_2$ first starts to crystallize and upon further cooling to a temperature lower than the eutectic point, a solid phase having the eutectic composition results wherein the greater part of the structure is occupied by a continuous Si matrix. The size of the dispersed particles can be controlled over a fairly wide range by either controlling the cooling rate or maintaining the melt for a prolonged period at a temperature within the range where both liquid and solid phase exist at the same time.

The advantages of the composite target produced in accordance with the second aspect of the invention are hereunder described by non-limiting working examples.

EXAMPLE 9

A disk (12.7 cm$^\phi$×0.6 cm$^T$) of composite target having a Si/Mo atomic ratio of 2.50 was prepared in accordance with the present invention. The target had the structure shown in FIG. 1 (×100) wherein $MoSi_2$ particles were dispersed in a continuous Si matrix. It consisted of 80 vol % of $MoSi_2$ and 0.1 vol % of pores, with the balance being Si. Discrete particles in this target had a size range of 10–200 μm.

As a comparative sample, a disk (12.7 cm$^\phi$×0.6 cm$^T$) of the conventional sintered target having a relative density of 95% (with 5 vol % of pores) was prepared from a mixture of $MoSi_2$ and Si powders (Si/Mo atomic ratio=2.50) by hot pressing at 1360° C. and 150 Kgf/cm$^2$ for a hold time of 1 hour.

The concentrations of impurities (i.e., Na, K, C and O) in each of the targets and their deflective strength were measured. Also measured were the compositional stability of the film formed by sputtering each target and the rate of deposition of such film. The results are shown in Table 8.

TABLE 8

| | Concentrations of impurity (ppm) | | | | Deflective strength (kg/mm$^2$) | Compositional stability Si/Mo (atomic ratio) | Film deposition rate (Å/min.) |
|---|---|---|---|---|---|---|---|
| | Na | K | C | O | | | |
| Composite target of the invention | 0.1 | 0.2 | 20 | 20 | 37 | 2.65 ± 0.01 | 1500 |
| Conventional sintered target | 10 | 20 | 300 | 2500 | 25 | 2.65 ± 0.02 | 300 |

The concentrations of Na and K were measured by both flame photometry and mass spectrometry; that of C was measured by infrared absorptoion spectrometry following induction heating; and the oxygen content was measured by gas chromatography following melting in a current of inert gas.

The compositional stability of the film formed by sputtering was examined by the following procedure: ten sputtering cycles were conducted with each of the two targets under the same conditions (ultimate pressure: $4 \times 10^{-7}$ Torr or below, argon pressure: $4 \times 10^{-3}$ Torr, current: 1 ampere, voltage: 250 volts, and sputtering duration: 2 minutes) and the 10 films each having a thickness of 3,000 Å that were obtained from each target were analyzed by Rutherford backscattering spectroscopy using H$^+$ ions as charged particles.

The rate of film deposition by sputtering was measured with a surface roughness meter using a contact needle under the following sputtering conditions: ultimate pressure $\leq 4 \times 10^{-7}$ Torr, Ar pressure = $4 \times 10^{-3}$ Torr, substrate-to-target gap = 70 mm, and input power = 250 watts d.c.

EXAMPLE 10

Composite target samples Nos. 1 to 25 were prepared. They had a structure wherein the particles shown in Table 9 below were dispersed in a continuous silicon matrix. The respective proportions of the dispersed particles, Si and pores in each sample and the atomic ratio of Si/M in its are also indicated in Table 9.

The concentrations of impurities in each of the samples and their deflective strength were measured. Also measured were the compositional stability of the film formed by sputtering each target and the rate of deposition of such film. Each of the measurements was made as in Example 9, and the results are shown in Table 9. FIG. 2 is a scanning electron micrograph (×50) of the structure of sample No. 10.

TABLE 9

| | Composite target | | | | Conc. of impurities (ppm) | | | | Deflective strength (Kg/mm$^2$) | Compositional stability of film Si/M (atomic ratio) | Film deposition rate (Å/min.) |
|---|---|---|---|---|---|---|---|---|---|---|---|
| | Structure (vol %) | | | Si/M (atomic ratio) | | | | | | | |
| No. | Dispersed particles | Porosity | Si | | Na | K | C | O | | | |
| 1 | WSi$_2$:75 | 0.1 | bal. | 2.66 | 0.1 | 0.2 | 14 | 10 | 36 | 2.70 ± 0.01 | 780 |
| 2 | TaSi$_2$:71 | ≦0.1 | bal. | 2.87 | 0.1 | 0.2 | 10 | 9 | 35 | 2.98 ± 0.01 | 1100 |
| 3 | TiSi$_2$:86 | 0.1 | bal. | 2.33 | 0.1 | 0.2 | 24 | 15 | 40 | 2.50 ± 0.01 | 940 |
| 4 | MoSi$_2$:58, WSi$_2$:12 | ≦0.1 | bal. | 2.86 | 0.1 | 0.2 | 11 | 8 | 34 | 3.00 ± 0.01 | 1370 |
| 5 | MoSi$_2$:48, TaSi$_2$:10 | ≦0.1 | bal. | 3.47 | 0.1 | 0.2 | 7 | 6 | 30 | 3.55 ± 0.01 | 1300 |
| 6 | MoSi$_2$:86, TiSi$_2$:6 | 0.5 | bal. | 2.16 | 0.2 | 0.3 | 35 | 20 | 40 | 2.24 ± 0.01 | 1660 |
| 7 | WSi$_2$:33, TaSi$_2$:27 | ≦0.1 | bal. | 3.38 | 0.1 | 0.2 | 6 | 5 | 31 | 2.47 ± 0.01 | 900 |
| 8 | WSi$_2$:83, TiSi$_2$:11 | 0.8 | bal. | 2.11 | 0.2 | 0.3 | 38 | 18 | 42 | 2.29 ± 0.01 | 780 |
| 9 | TaSi$_2$:62, TiSi$_2$:11 | 0.1 | bal. | 2.79 | 0.1 | 0.2 | 13 | 11 | 36 | 2.92 ± 0.01 | 1060 |
| 10 | MoSi$_2$:22, WSi$_2$:17, TaSi$_2$:11 | ≦0.1 | bal. | 3.96 | 0.1 | 0.2 | 4 | 5 | 28 | 4.00 ± 0.01 | 1050 |
| 11 | MoSi$_2$:26, WSi$_2$:34, TiSi$_2$:5 | ≦0.1 | bal. | 3.09 | 0.1 | 0.2 | 7 | 8 | 29 | 3.20 ± 0.01 | 1060 |

TABLE 9-continued

| | Composite target | | | | | | | | Deflec-tive strength $(Kg/mm^2)$ | Compositional stability of film Si/M (atomic ratio) | Film deposition rate (Å/min.) |
|---|---|---|---|---|---|---|---|---|---|---|---|
| | Structure (vol %) | | | Si/M (atomic ratio) | Conc. of impurities (ppm) | | | | | | |
| No. | Dispersed particles | Porosity | Si | | Na | K | C | O | | | |
| 12 | $MoSi_2$:21, $TaSi_2$:49, $TiSi_2$:6 | 0.1 | bal. | 2.66 | 0.1 | 0.2 | 16 | 12 | 36 | 2.80 ± 0.01 | 1220 |
| 13 | $WSi_2$:25, $TaSi_2$:37, $TiSi_2$:18 | 0.2 | bal. | 2.52 | 0.1 | 0.2 | 23 | 15 | 38 | 2.67 ± 0.01 | 970 |
| 14 | $MoSi_2$:13, $WSi_2$:29, $TaSi_2$:21, $TiSi_2$:6 | ≦0.1 | bal. | 2.81 | 0.1 | 0.2 | 9 | 10 | 35 | 2.94 ± 0.01 | 880 |
| 15 | $(Mo_{0.5}W_{0.5})Si_2$:83 | 0.1 | bal. | 2.41 | 0.1 | 0.2 | 25 | 16 | 40 | 2.57 ± 0.01 | 1210 |
| 16 | $(Mo_{0.5}Ta_{0.5})Si_2$:67 | ≦0.1 | bal. | 3.03 | 0.1 | 0.2 | 11 | 10 | 33 | 3.14 ± 0.01 | 1250 |
| 17 | $(Mo_{0.6}Ti_{0.4})Si_2$:88 | 0.2 | bal. | 2.27 | 0.1 | 0.2 | 27 | 18 | 40 | 2.44 ± 0.01 | 1380 |
| 18 | $(W_{0.1}Ta_{0.9})Si_2$:77 | 0.1 | bal. | 2.64 | 0.1 | 0.2 | 18 | 12 | 36 | 2.78 ± 0.01 | 1070 |
| 19 | $(W_{0.4}Ti_{0.6})Si_2$:72 | ≦0.1 | bal. | 2.79 | 0.1 | 0.2 | 13 | 10 | 33 | 2.92 ± 0.01 | 860 |
| 20 | $(Ta_{0.5}Ti_{0.5})Si_2$:62 | ≦0.1 | bal. | 3.30 | 0.1 | 0.2 | 5 | 8 | 30 | 3.39 ± 0.01 | 970 |
| 21 | $MoSi_2$:56, $(Ta_{0.5}Mo_{0.5})Si_2$:15 | ≦0.1 | bal. | 2.83 | 0.1 | 0.2 | 14 | 8 | 34 | 2.96 ± 0.01 | 1470 |
| 22 | $WSi_2$:70, $(W_{0.4}Ti_{0.6})Si_2$:12 | 0.2 | bal. | 2.44 | 0.1 | 0.2 | 23 | 16 | 39 | 2.60 ± 0.01 | 790 |
| 23 | $MoSi_2$:32, $(Mo_{0.4}Ti_{0.6})Si_2$:24 | ≦0.1 | bal. | 3.59 | 0.1 | 0.2 | 5 | 6 | 28 | 3.66 ± 0.01 | 1240 |
| 24 | $WSi_2$:18, $(Ta_{0.9}W_{0.1})Si_2$:45 | ≦0.1 | bal. | 3.23 | 0.1 | 0.2 | 7 | 9 | 32 | 3.33 ± 0.01 | 960 |
| 25 | $(Mo_{0.5}W_{0.5})Si_2$:38, $(Ta_{0.5}Ti_{0.5})Si_2$:37 | 0.1 | bal. | 2.68 | 0.1 | 0.2 | 12 | 10 | 36 | 2.82 ± 0.01 | 980 |

As the data in Tables 8 and 9 show, the composite target samples prepared in accordance with the invention were extremely low not only in oxygen content but also in the concentrations of other impurities (i.e., Na, K and C), as compared with the conventional sintered target. Furthermore, the samples of the invention had high deflective strengths and could be sputtered a number of times to provide films that were stabler in composition than those obtained from the conventional sintered target. As a further advantage, the rate of film deposition realized by sputtering the target samples of the invention was significantly higher than that achieved by sputtering the conventional sintered target.

As a consequence, the films formed by sputtering the composite target of the invention have appreciably reduced impurity levels and hence, very low electric resistivities. In addition, these films provide electrodes that will experience minimum variations in potential from one electrode to another. The composite target of the invention enables sputtering to be perfomred 5 times as fast as in the case using the conventional sintered target.

What is claimed is:

1. A process for producing a sputtering target material that is low in oxygen content and is used for forming a metal silicide film suitable for use in electrode wiring in a semiconductor device, said process comprising the steps of preparing a calcined body composed of at least one silicide-forming metal component and a silicon component, and impregnating molten silicon in said calcined body by means of contact with said molten silicon, thereby forming a sintered body with low oxygen content that is made of a metal silicide and silicon.

2. A process according to claim 1 wherein said calcined body contains a compound made of a silicide-forming metal component and a silicon component.

3. A process according to claim 1 wherein said calcined body is prepared from a mixture of the powders of a silicide-forming metal component and a silicon component that are blended in such proportions that the atomic ratio of silicon to the metal component is greater than 2 but not exceeding 4.

4. A process according to claim 1 wherein said silicide-forming metal component is at least one metal element selected from the group consisting of Mo, W, Ta, Ti, V, Cr, Zr, Nb, Hf, Re and Y.

5. A process according to claim 4 wherein said silicide-forming metal component is at least one high-melting metal element selected from the group consisting of Mo, W, Ta and Ti.

6. A process according to claim 2 wherein said compound made of a silicide-forming metal component and a silicon component is represented by the formula $MSi_2$ (wherein M is at least one metal element selected from the group consisting of Mo, W, Ta, Ti, V, Cr, Zr, Nb, Hf, Re and Y).

7. A process according to claim 2 wherein said compound made of a silicide-forming metal component and a silicon component is any compound other than those which are represented by the formula $MSi_2$ (wherein M is at least one metal element selected from the group consisting of Mo, W, Ta, Ti, V, Cr, Zr, Nb, Hf, Re and Y).

8. A process according to claim 7 wherein said compound made of a silicide-forming metal component and a silicon component is $Mo_5Si_3$.

9. A target material having a structure wherein the particles of a high-melting metal disilicide of the formula $MSi_2$ (wherein M=Mo, W, Ta or Ti) and/or a solid solution compound of said high-melting metal disilicide are dispersed in a continuous silicon matrix.

10. A target material according to claim 9 wherein the continuous silicon matrix accounts for not smaller than 5 vol % of the target.

11. A target material according to claim 9 or 10 wherein the dispersed particles of the high-melting metal disilicide and/or the solid solution compound of said high-melting metal disilicide are present as discrete particles which are either circular or elliptical in cross section.

12. A target material according to claim 9 or 10 wherein the dispersed particles of the high-melting metal disilicide and/or the solid solution compound of said high-melting metal disilicide are present as a mixture of two particulate forms, one being a discrete particle which is either circular or elliptical in cross section and the other being an agglomerate of two or more discrete particles.

13. A target material according to claim 9 or 10 wherein the dispersed particles of the high-melting metal disilicide and/or the solid solution compound of said high-melting metal disilicide are present as agglomerates of discrete particles which are either circular or elliptical in cross section.

14. A target material according to claim 11 wherein the discrete particles which are either circular or elliptical in cross section have sizes ranging from 5 to 500 μm.

15. A target material according to claim 12 wherein the discrete particles which are either circular or elliptical in cross section have sizes ranging from 5 to 500 μm.

16. A target material according to claim 13 wherein the discrete particles which are either circular or elliptical in cross section have sizes ranging from 5 to 500 μm.

17. A target material according to claim 9 or 10 that has a porosity of not higher than 1 vol %.

18. A target material according to claim 11 that has a porosity of not higher than 1 vol %.

19. A target material according to claim 12 that has a porosity of not higher than 1 vol %.

20. A target material according to claim 13 that has a porosity of not higher than 1 vol %.

21. A target material according to claim 14 that has a porosity of not higher than 1 vol %.

22. A target material according to claim 15 that has a porosity of not higher than 1 vol %.

23. A target material according to claim 16 that has a porosity of not higher than 1 vol %.

* * * * *